(12) United States Patent
Kokkeler

(10) Patent No.: US 7,321,264 B2
(45) Date of Patent: Jan. 22, 2008

(54) METHOD, ARRANGEMENT AND DEVICE FOR CONTROLLING PREDISTORTION

(75) Inventor: Andre Kokkeler, Borne (NL)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 34 days.

(21) Appl. No.: 10/596,041

(22) PCT Filed: Nov. 26, 2003

(86) PCT No.: PCT/NL03/00833

§ 371 (c)(1),
(2), (4) Date: May 25, 2006

(87) PCT Pub. No.: WO2005/053152

PCT Pub. Date: Jun. 9, 2005

(65) Prior Publication Data

US 2007/0096811 A1    May 3, 2007

(51) Int. Cl.
H03F 1/26 (2006.01)
(52) U.S. Cl. .................... 330/149; 455/114.3
(58) Field of Classification Search ............... 330/149; 455/114.3; 375/296, 297
See application file for complete search history.

(56) References Cited

U.S. PATENT DOCUMENTS

| | | | |
|---|---|---|---|
| 5,489,875 A | | 2/1996 | Cavers |
| 6,141,390 A | * | 10/2000 | Cova ........................ 375/297 |
| 6,600,792 B2 | * | 7/2003 | Antonio et al. ............ 375/297 |
| 6,774,834 B2 | * | 8/2004 | Dartois ..................... 341/144 |
| 6,998,909 B1 | * | 2/2006 | Mauer ......................... 330/2 |
| 7,035,345 B2 | * | 4/2006 | Jeckeln et al. ............ 375/296 |
| 2003/0179831 A1 | | 9/2003 | Gupta et al. |
| 2007/0069813 A1 | * | 3/2007 | Li et al. .................... 330/149 |

FOREIGN PATENT DOCUMENTS

| WO | WO 01/08294 | 2/2001 |
|---|---|---|
| WO | WO 01/08294 A | 2/2001 |

* cited by examiner

Primary Examiner—Patricia Nguyen

(57) ABSTRACT

A predistortion control device (1). The device has a first predistortion control input connectable to a power amplifier output (21); a second predistortion control input (11) connectable to a signal contact of a predistortion device; and a predistortion control output (12) connectable to a control contact of the predistortion device. The predistortion control device (1) further includes a cross-correlator device (110). The cross-correlator device (110) is connected with a first cross-correlator input (1101, 1101I, 1101Q) to the first predistortion control input and a second cross-correlator input (1102, 1102I, 1102Q) to the second predistortion control input (11). The cross-correlator device (110) is further has a cross-correlator output (1112) at which a cross-correlation signal can be presented, the cross-correlation signal representing a measured cross-correlation of signals presented at the first cross-correlator input (1101, 1101I, 1101Q) and the second cross-correlator input (1102, 1102I, 1102Q). The predistortion control device (1) further has a predistortion function selector device (120)(120), connected with a selector input to the cross-correlator output (1112), and with a selector output to the predistortion control output (12), at which selector output a predistortion control signal can be presented. The predistortion control signal representing a predistortion function determined on the basis of said cross-correlator signal.

26 Claims, 6 Drawing Sheets

METHOD, ARRANGEMENT AND DEVICE FOR CONTROLLING PREDISTORTION

BACKGROUND OF THE INVENTION

The invention relates to a predistortion control device. The invention further relates to an assembly including a predistortion control device, and to a predistortion control method. The invention also relates to an electronic device including a predistortion control device.

Power amplifiers are generally known in the art. Power amplifiers are used, for example, in wireless transmission systems to amplify a signal such that the signal has sufficient energy to be transmitted via an antenna. However, often the performance is limited by the non-linear behaviour of the Power Amplifier (PA). In an ideal PA, the amplitude of the output signal is a linear multiplication of the amplitude of the input signal, and therefore equal to the input amplitude times a multiplication constant, i.e. described mathematically:

$$G(x)=Const*x,$$

in which G(x) represents the output signal, x the input signal, and Const represents the multiplication constant. However, in reality every power amplifier has a certain deviation of the ideal PA. The deviation causes the presence of non-linear components in the output signal, i.e. described mathematically:

$$G(x)=Const*x+f(x),$$

with f(x) representing a non-linear function of the input signal x.

The effect of this non-linear behaviour is spectral distortion. If the input signal before (power) amplifications is band-limited (concentrated within a specified frequency range), the signal at the output of the Power Amplifier will have a significant amount of energy outside the specified frequency range of the input signal. Telecommunication standards like GSM and UMTS specify the maximum amount of energy present outside the specified frequency range and thereby implicitly impose a maximum to the 'non-linearity' of Power Amplifiers.

In the art, several linearisation techniques are known to counteract the non-linearity of a PA, and in order to provide a linearisation of Power Amplifiers at real time. A first technique is feed forward. In this technique, an estimate of the distortion by the non-linearity of the PA is obtained. Based on the estimate, a correction signal is subtracted from the amplified signal presented at the output of the PA, in order to correct for the non-linear components present in the amplifier signal. Another technique is feedback. In this technique, the difference between the input signal of the power amplifier and the output signal thereof is minimised by means of a suitable control loop.

Furthermore, predistortion systems are known. Predistortion systems, include a predistortion device which adds, from a mathematical point of view, a predistortion signal to the input signal of the power amplifier. In practical systems, a look-up table can be used which maps an input sample onto an output sample. The combined input signal is presented to the power amplifier input. The predistortion signal is such that the output of the PA resulting from the combined predistortion signal and the original input signal approximates the output of an ideal power amplifier for the original input signal as good as possible.

The predistortion device is set by means of a predistortion control device, which determines from time to time an approximation of the non-linearity of the power amplifier. The predistortion control device provides to the predistortion device a predistortion control signal representing the approximation, to correct for example for changes in the behaviour of the power amplifier due to thermal changes or aging of the power amplifier.

However, a draw-back of these known linearisation techniques is that stringent requirements are imposed on the devices used in the linearisation, because the analogue components, such as analog-to-digital converters and frequency converters, need to be highly linear and stable over a relatively large frequency range. These requirements limit the performance of the linearisation techniques.

Predistortion systems have the additional draw-back that the processing involved with the approximation of the non-linearity of the power amplifier is complex, and has to be executed at the sample rate of the predistortion control device. Predistortion systems therefore have a relatively high power consumption and are costly to implement.

SUMMARY OF THE INVENTION

It is a goal of the invention to provide a device which enables a relaxation of the requirements imposed on the devices used a predistortion techniques.

Such a predistortion control device enables a relaxation of the requirements imposed on the devices used in the predistortion control device, because noise has less effect on the result of the determination of the predistortion function since the cross-correlator device averages, at least to a certain extend, the signals presented at the respective cross-correlator inputs, which reduces the effect of noise. Accordingly, the noise requirements concerning the analogue devices connected to the cross-correlator inputs can be relaxed.

In addition, the predistortion function selector device operate at a lower processing speed, since the frequency at which a cross-correlation function is provided is lower than the rate at which the signals are provided to the cross-correlator device. Thus, at least the requirements on processing speed of the predistortion function selector can be reduced.

Specific embodiments of the invention are set forth in the dependent claims. Further details, aspects and embodiments of the invention will be described, by way of example only, with reference to the figures in the attached drawings.

DETAILED DESCRIPTION

Figure 1:
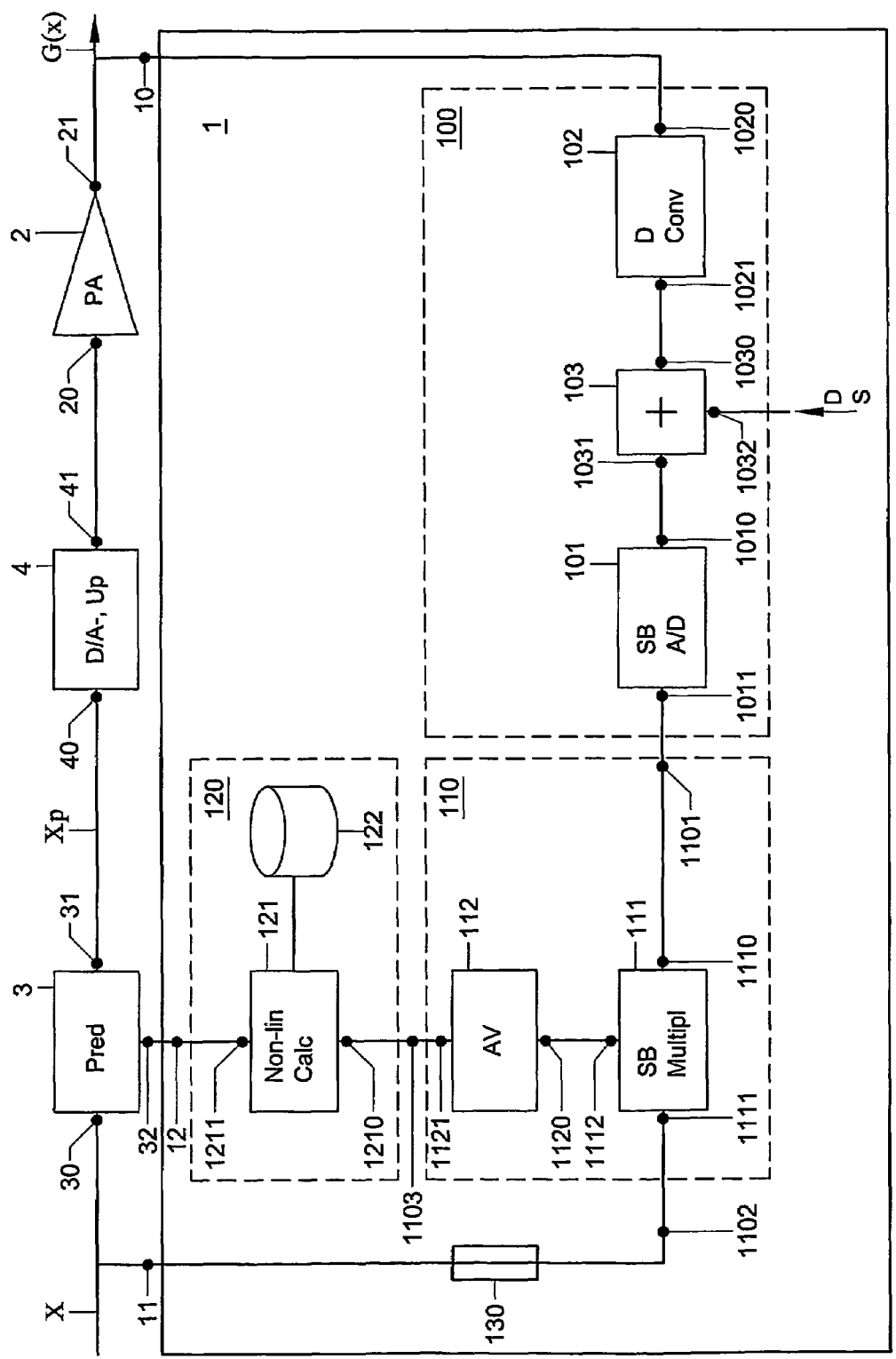
FIG. 1 schematically shows a block diagram of an example of a first embodiment of a predistortion control device connected to a predistortion device and a PA.

FIG. 1 schematically shows a power amplifier 2. A predistortion device 3 is connected to the power amplifier 2.

An example of an embodiment of a predistortion control device 1 according to the invention is connected to the power amplifier 2 and the predistortion device 3.

In operation, an amplifier input signal is presented at an amplifier input 20 of the power amplifier 2. The power amplifier 2 amplifies the amplifier input signal and outputs the amplified signal as an amplifier output signal G(x) at an amplifier output 21. Because the power amplifier 2 is a non-ideal power amplifier, the amplifier output signal G(x) will include a linear amplification component Cx, and non-linear components f(x).

The predistortion device 3 has a predistortion input 30 at which an input signal x can be presented, which may for example be a WDCMA (Wideband Code Division Multiple Access) signal, such as an UMTS signal, or any other signal suitable for the specific implementation. The predistortion device 3 further has a predistortion output 31 connected to the amplifier input 20 of the power amplifier 2, and a predistortion control contact 32 at which a predistortion control signal can be presented to the predistortion device 3.

In this example, the predistortion output 31 is communicatively connected to the amplifier input 20, i.e. in this example indirectly, via a digital-to-analog up converter (D/A up converter) 4. In the example of FIG. 1, the input signal x, and the predistorted signal $x_p$, are digital signals at a certain frequency. The output signal $x_p$ is converted by the D/A up converter 4 to an analog signal with a frequency suitable to by emitted by an antenna, e.g. an analog signal at radio frequency (RF). The analog signal is then presented at the amplifier input 20, amplified by the power amplifier 2, and an amplified signal is outputted at the amplifier output 21.

Alternatively, the predistortion output 31 may be directly connected to the amplifier input 20, for example if the input signal x has a frequency which is already within the frequency band of the power amplifier 2.

The predistortion device 3 performs a predistortion on the input signal x in accordance with a predistortion function pred(x) to correct for a non-linearity in the amplification performed by the power amplifier 2, such that the non-linear component f(x) in the amplifier output signal G(x) resulting from the predistorted signal x+pred(x) is as small as possible. A predistorted signal $x_p$ equal to x+pred(x) is presented at a predistortion output 31. In the example of FIG. 1, a signal based on the predistorted signal x+pred(x) is thus presented at the amplifier input 20 by the digital-to-analog up converter 4, and amplified by the power amplifier 2.

Figure 2:
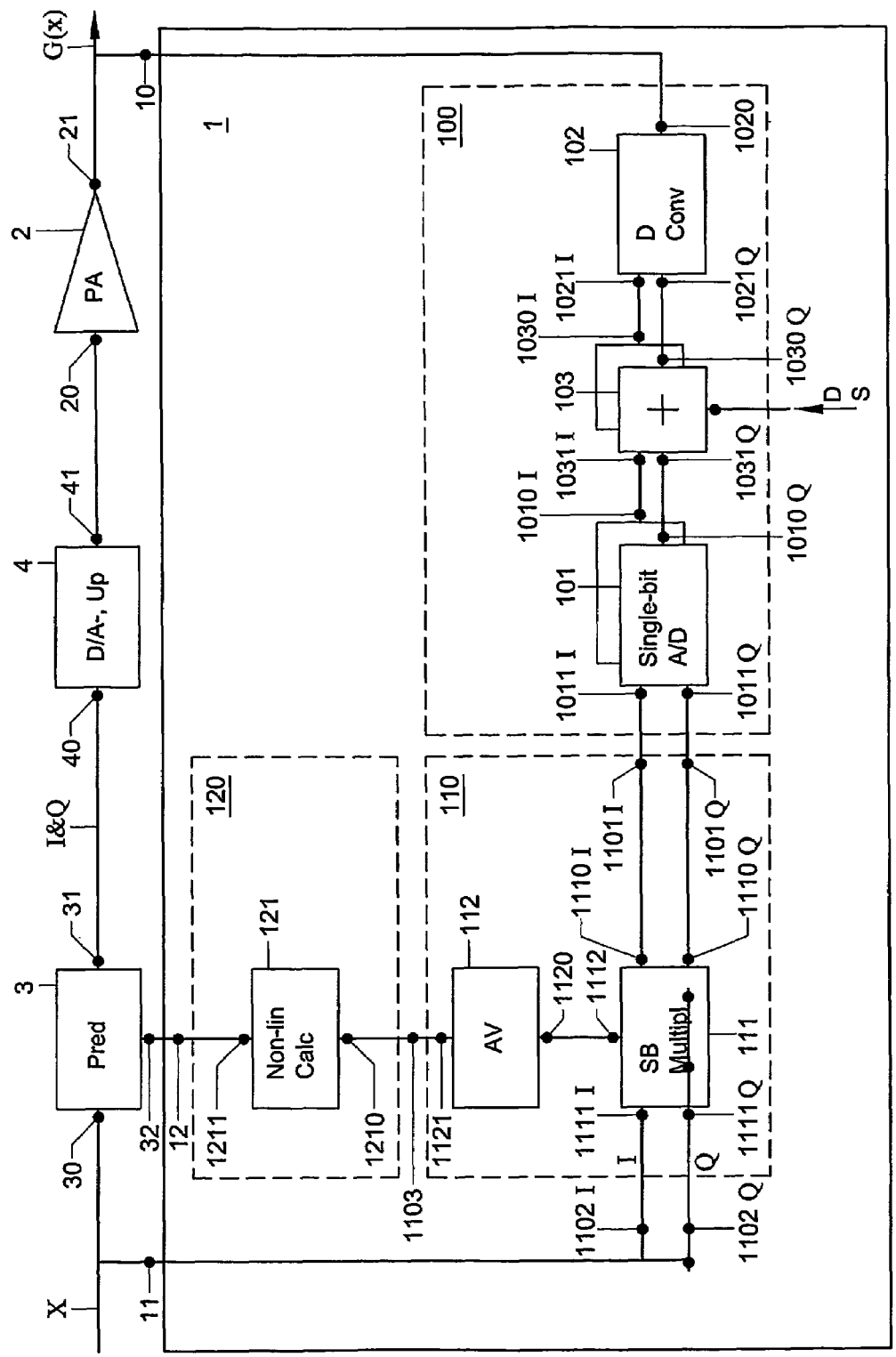
FIG. 2 schematically shows a block diagram of an example of a second embodiment of a predistortion control device connected to a predistortion device and a PA.
Figure 3:
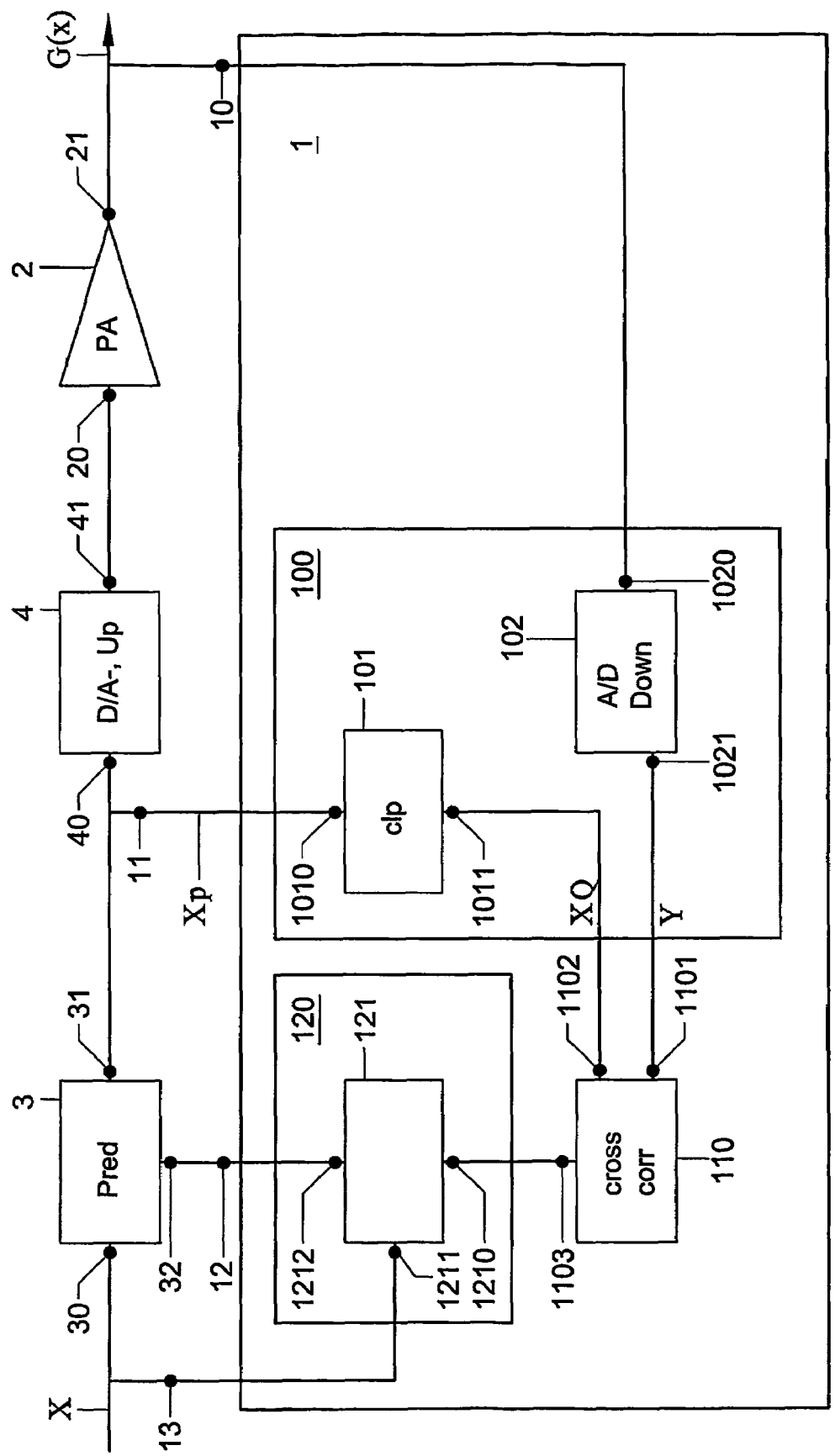
FIG. 3 schematically shows a block diagram of an example of a third embodiment of a predistortion control device connected to a predistortion device and a PA.
Figure 4:
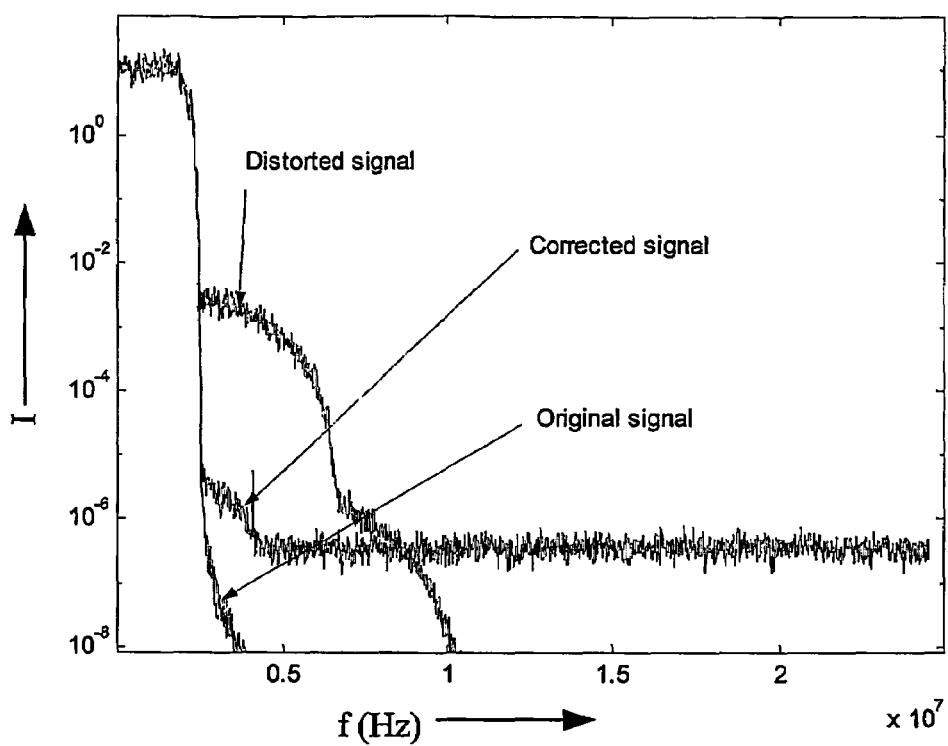
FIGS. 4-7 show graphs of results of simulations of examples of predistortion methods according to the invention.

To minimise the non-linear component f(x), the predistortion function pred(x) is controlled by a predistortion control signal presented at the predistortion control contact 32 of the pre distortion device 3. In response to the predistortion control signal, the predistortion device 3 uses a corresponding predistortion function pred(x) to distort the input signal x. In the examples of FIGS. 1-3, the predistortion control device 1 provides the predistortion control signal at a predistortion control output 12 of the predistortion control device 1.

The predistortion control device 1 is connected with a first predistortion control input 10 to the power amplifier output 20. Via this connection, the output signal G(x) of the power amplifier 2 can be provided to the predistortion control device 1. A second predistortion control input 11 is connected to a signal contact of the predistortion device 3, in this example the predistortion input 30. Via the second predistortion control input 11, (a signal based on) the input signal x can be provided to the predistortion control device 1.

In this example, the predistortion control device includes (from the first predistortion control input 10 and the predistortion control output 12 and in that order) a feedback path 100, a cross-correlator device 110, and a predistortion function selector 120.

A first cross-correlator input 1101 of the cross-correlator device 110 is communicatively connected to the first predistortion control input 10, in this example indirectly via the feedback path 100. A second cross-correlator input 1102 is connected to the second predistortion control input 11. Thus, at the first cross-correlator input 1101 a signal based on the amplifier output signal G(x) is presented, and at the second cross-correlator input 1102 a signal based on the input signal x is presented. The cross-correlator further has a cross-correlator output 1103 which is connected to an input 1201 of the predistortion function selector 120.

The cross-correlator device 110 determines a cross-correlation value of the signals presented at its input. A cross-correlation value $R(\tau)$ of time dependent signals x(t) and G(t) can be derived by an operation which can be mathematically described as $$R(\tau) = \int_{-\infty}^{\infty} x(t)^* G(t+\tau) d\tau$$

in which t represents the time, $\tau$ represents time difference and signals x and G, and x* denotes the complex conjugate of signal x. This, however describes the ideal continuous case. In practical digital systems, the cross-correlation value $R(\tau)$ is determined by:

$$R(\tau) = \frac{1}{T}\sum_{t=1}^{T} x(t)^* G(t+\tau)$$

in which T equals the sampling period of the signal x and G.

It is noted that cross-correlation methods and cross-correlator devices are generally known in the art, and for briefness sake not described in full detail.

The cross-correlator 113 determines the cross-correlation value for different time shifts between the signals. In an operating state of the predistortion control device 1, cross-correlation signals are presented at the cross-correlator output 1103. The cross-correlation signals represent the cross-correlation value of the signals presented at the cross-correlator inputs 1101,1102 for a different time shifts $\tau$.

The cross-correlation values for different time shifts $\tau$ are stored in a memory (not shown). The stored values and corresponding time shifts together constitute a cross-correlation function. This cross-correlation function is referred to as the measured cross-correlation R_m.

The predistortion function selector device 120 is connected with a selector input 1210 to the output 1103 of the cross-correlator 110. The predistortion function selector device 120 includes a memory 122 in which data representing a cross-correlation model is stored. The cross-correlation model can for example be a table of data representing the cross-correlation as would be determined if the power amplifier was an ideal power amplifier, a mathematically description of the cross-correlation of a power amplifier, or another suitable cross-correlation model.

The predistortion function selector device 120 includes a non-linearity calculator 121 which compares the measured cross-correlation function R_m with the cross-correlation model stored in the memory, and determines, on the basis of the comparison, a suitable predistortion function.

The requirements on the processing speed of the predistortion function selector device 120 may be relaxed, and the predistortion function selector device 120 can for example be implemented as a digital signal processor or general purpose micro-processor, which are commonly available at low costs. The determination of the suitable predistortion function (G(x) or G(x,y)) of the power amplifier can be performed at a lower rate than the determination of measured cross-correlation values, because the measured cross-correlation function R_m includes a number of measured cross-correlation values, and the determination is based on the cross-correlation function R_m.

The non-linearity calculator 121 may, for example, be arranged to perform a polynomial fit of the cross-correlation model onto the measured cross-correlation R_m, and determine from this fit a polynomial which describes to a desired accuracy the non-linear behaviour of the power amplifier 2.

At a selector output 1211, which is connected to the predistortion control output 12, a predistortion control signal is presented which represents the selected predistortion function, e.g. the coefficients of the fitted polynomial. Via the control output 12, this predistortion control signal is presented to the control contact 32 of the predistortion device 3.

In the example of FIG. 1, the cross-correlator 110 is connected to the first predistortion control input 10 via the feedback path 100. The feedback path 100 includes a quantiser device 101 which is communicatively connected with a quantiser input 1010 to the first predistortion control input 10, in this example indirectly via down converter (D-conv) 102 and distorter 103. A quantiser output 1011 is connected to the first cross-correlator input 1101. The quantiser device 101 quantises signals presented at its input into a number of discrete levels. For example, the quantiser can quantise analog signals into digital signals of a certain bit length.

Thus, at the first cross-correlator input 1101 signals of a limited precision are presented. Thereby, the amount of processing power required in the cross-correlator device 110 is reduced, since the processing accuracy of the cross-correlator device 110 can reduced to the precision of the signals at the quantiser output 1011. This reduced precision is compensated by longer integration times T for the cross-correlation function $R(\tau)$.

In the example of FIG. 1, the quantiser device 101 is implemented as a single-bit quantiser, which converts analog signals presented at its input to single-bit digital signals, i.e. into a positive value (also known as a binary one) if the amplitude of the analog signal is equal to or exceeds a threshold value, and a negative value (also known as a binary zero) if the amplitude of the analog signal is below the threshold value. Such a quantiser device is also referred to as a single-bit analog-to-digital converter (SB A/D) or comparator. In general, single-bit A/D converters have a low power consumption, and such converters are widely available at low costs.

The operation of a single-bit analog-to-digital converter can be described mathematically as:

$$x_Q(x_P) = \begin{cases} -1 & x_P < 0 \\ 1 & x_P \geq 0, \end{cases}$$

in which $x_Q$ represents the output signal of the single-bit analog-to-digital converter, $x_p$ the input of the single-bit analog-to-digital converter, and the threshold value is set to 0.

In the example of FIG. 1, the input signal x is supposed to be a digital signal of a certain bit length a clipper device 130 is present between the second input 11 of the predistortion control device 1 and the second cross-correlator input 1102. The clipper device 130 reduces the bit length of the input signal x to one bit.

The cross-correlator 110 includes a digital multiplier, in this example a single-bit multiplier (SB multipl) 111, and an averager device (av) 112. The signals presented at the cross-correlator inputs 1101,1102 are the single bit output of the Single Bit A/D and the single-bit representation of the original signal x, respectively. The cross-correlation function thereof is determined by single-bit multiplication of these signals, and averaging the result of the multiplication.

The single-bit multiplier 111 is connected with a first multiplier input 1110 to the single-bit analog-to-digital converter 101, and with a second multiplier input 1111 to the second cross-correlator input 1102. The operation of the single-bit multiplier 111 can be described mathematically as:

$$x_{out} = \begin{cases} 1 & \text{if } x_1 = x_2 \\ -1 & \text{if } x_1 \neq x_2, \end{cases}$$

in which equation $x_{out}$ represents the output of the single-bit multiplier, and $x_1,x_2$ represent the respective cross-correlator input signals. Digital multiplication of quantised signals is a relatively non-complex operation. Especially multiplication of single-bit signals is a simple operation, since the output is either the same as the input or the reverse thereof and can for example be performed by means of an AND device. Accordingly, a cross-correlator device including a digital multiplier, and especially a single-bit multiplier has a low complexity.

In addition, the averager device has a low complexity as well, because integration of single-bit signals can be implemented as a simple adding operation. The complexity of the cross-correlator device 110, and accordingly the predistortion control device 1 in the example of FIG. 1, is therefore further reduced.

In the example of FIG. 1, besides the single-bit analog-to-digital converter 101, the feedback path 100 includes a down-converter (D-conv) 102 which converts the output signal of the power amplifier 2 to the frequency of the input signal x of the predistortion device 3, and a distortion device 103 between the down-converter 102 and the single-bit analog-to-digital converter 101. The distortion device 103 is communicatively connected with a distortion input 1030 to the first predistortion control input 10, in this example indirectly via the down converter 102. A distortion output 1031 is connected to the quantiser input 1010.

The distortion device 103 adds a dithering signal (ds) to the signal from the power amplifier output 21, before the analog-to-digital A/D conversion performed by the converter 103. Thereby, the accuracy of the output of the average device 112, and hence the cross-correlator device 110 is improved, since the dithering signal smoothes the transition between the coarsely quantized (in this case single-bit) signals in the overall average.

In the examples of FIGS. 1-3, the distortion device is a random distortion device, which adds a random signal. The random signals can for example be generated in accordance with a Gaussian probability distribution, a uniform probability distribution or another suitable distribution. As an alternative, the distortion device may add a non-random distortion signal, such as a periodic signal for example a sawtooth signal a square wave signal a sinusoidal signal or another periodic signal.

FIGS. 4-7 show graphs of results of simulations of predistortion methods performed by a simulation model of a digital predistortion system according to the embodiment of FIG. 1.

In the simulation, a WCDMA system with the real part of WCDMA signals was implemented. The non-linearity of the Power Amplifier is defined by the transfer function G(x). As a reference transfer function, G(x)=4.5*atan(x/4.5) was used in the simulations as the transfer function of the power amplifier. The power level of the output signal of the power amplifier 2 was normalised to 8 dB below the 1 dB compression point of this function.

Noise with a Gaussian probability distribution was injected into the Feedback Path 100 by the distortion device 102. The noise power was equal to the signal power. However, other power levels may also be used. The combined signal (signal plus injected noise) was then presented to a single-bit quantiser, which decided whether the signal is above or below a certain reference level (a DC level). In the simulations, the sampling rate of the quantiser was equal to the baseband clock rate.

The single-bit signal was fed into a single-bit correlator 110 as shown in FIG. 1 where the signal was cross-correlated with the single-bit representation of the original input signal x. The cross-correlator calculated the cross-correlation value for a series of different time shifts between the input signals (16, each being a multiple of 1 sample period, and with a fixed offset of 32 periods) using single-bit multiplication and integration. After a specified integration period (32 K sample periods in the simulator), the series were normalised, resulting in a 'measured correlation function R_m' over 16 sample periods with a 32 period offset. The measured correlation function R_m was passed to the predistortion function selector device 120 which was run at a lower processing rate than the cross-correlator 110.

The following model for the cross-correlator function was used in the predistortion function selector device 120. The input signal x was modelled as a source with Gaussian amplitude distribution and limited bandwidth. The model correlation function in case of a perfectly linear Power Amplifier was used, and for the measured series the ideal values ρ were calculated, and combined to a model correlation function R_m(ρ).

The following mathematical relation was used:

$$\int_{-\infty}^{\infty} f(x) * g(x, \rho) * h(x, \rho) * dx \cong R\_m(\rho)$$

with $$f(x) = \frac{1}{\sqrt{2\pi}} * e^{-\frac{1}{2}x^2}$$

$$g(x, \rho) = \text{erf}\left(\frac{\sqrt{|\rho|} * G(x)}{\sqrt{2(1-|\rho|) + \sigma_n^2}}\right)$$

$$h(x, \rho) = \text{erf}\left(\frac{\sqrt{|\rho|} * x}{\sqrt{2(1-|\rho|)}}\right)$$

where G(x) represents the amplitude transfer function of the Power Amplifier, $\sigma_n^2$ the power of the noise injected into the Feedback Path 100, and erf the mathematical error function.

A polynomial fit of the function G(x) was performed, resulting in a fitted cross-correlation R_m'(ρ), to find an approximation G'(x) of the amplitude transfer function G(x). The approximation method used in the simulations was based on a minimalisation of the variance of R_m'(ρ)−R_m(ρ).

From the resulting approximation G'(x), the inverse of G'(x), which is defined as $G'^{-1}(x)$, was then be used to update the predistortion device 3.

Figure 5:
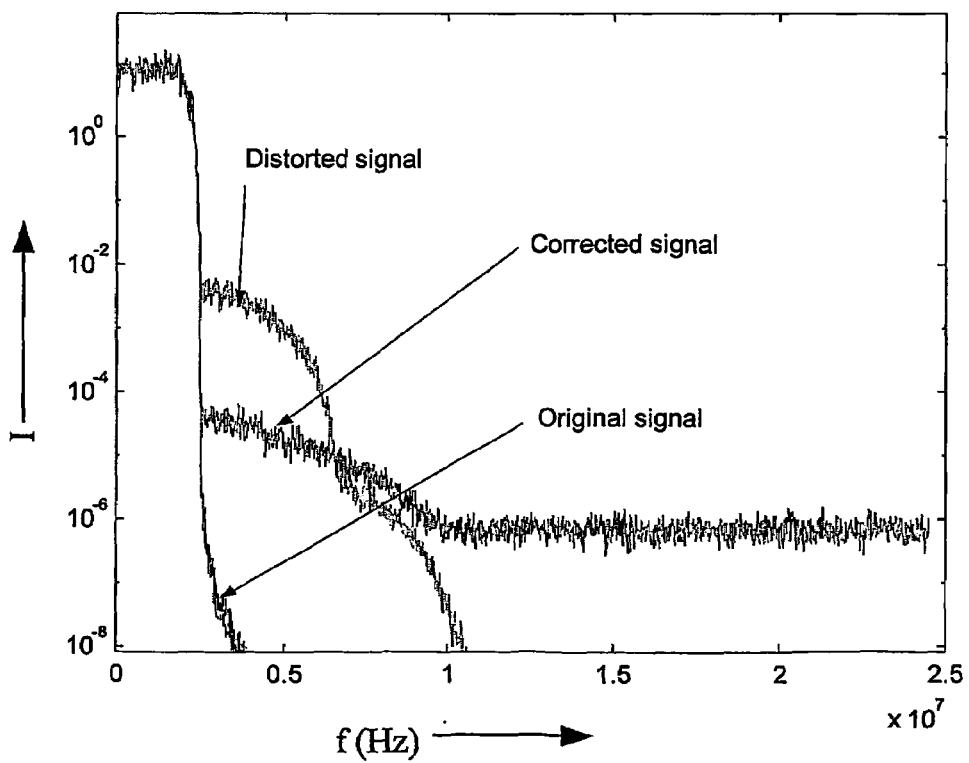
Figure 6:
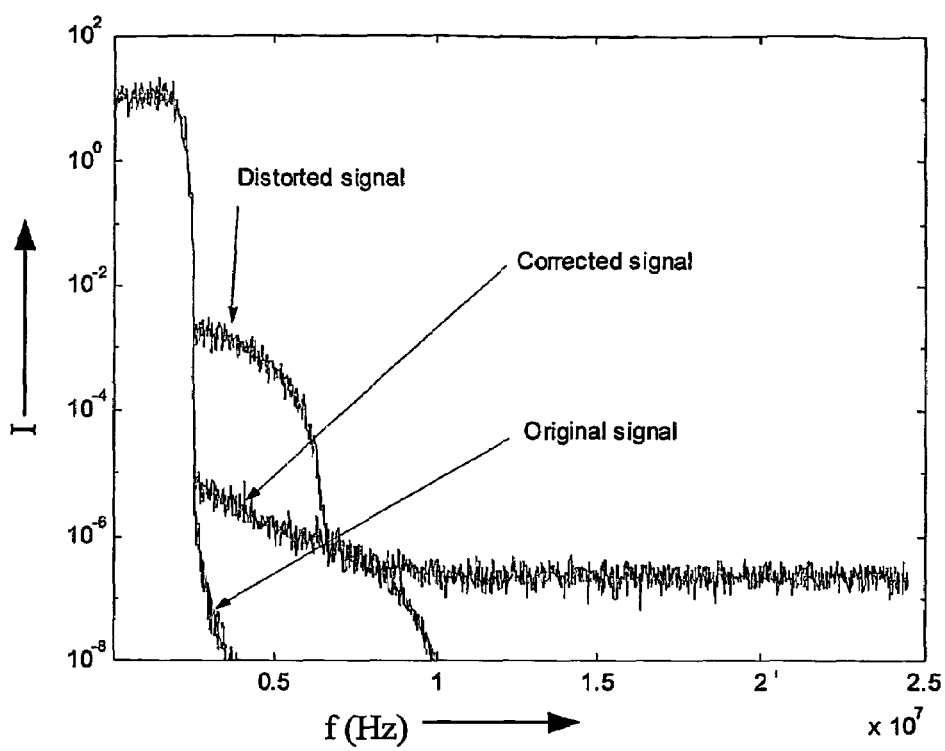
Figure 7:
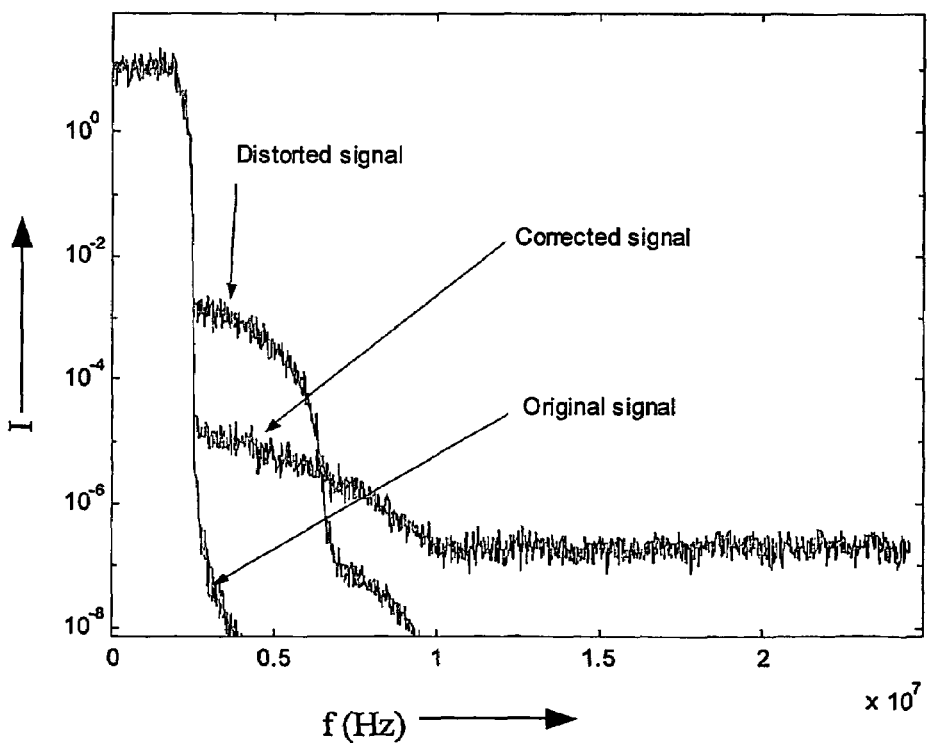

In the graphs of FIGS. 4-7 the power spectral densities of the original signal x, the distorted signal G(x), and the corrected signal $G'^{-1}(G(x))$ are shown. Four different transfer functions have been analysed and the deviations from linear gain of these transfer functions are shown in the graphs of FIGS. 4-7 In the graph of FIG. 4, 4.0*atan(x/4.0) was used as the model transfer function G(x) of the power amplifier. In FIG. 5, 4.5*atan(x/4.5) was used as the model transfer function G(x) of the power amplifier. In FIG. 6, 5.0*atan(x/5.0) was used as the model transfer function G(x) of the power amplifier. In FIG. 7, 5.0*erf(x/5.642) was used as the model transfer function G(x) of the power amplifier.

As can be seen in the FIGS. 4-7, because of imperfections in the process of calculating the predistortion values ($G'^{-1}(x)$) out of the estimated amplitude transfer function of the Power Amplifier (G'(x) which equals in this case G(x)), the spectrum after correction is not equal the original spectrum, but at least for frequencies close the frequency band of the original signal (the adjacent channels), the spurious power is reduced significantly.

FIG. 2 schematically shows an example of a predistortion control device suitable for in a complex system. In a complex system the signals before up-conversion and after down-conversion are complex signals and consist of an in-phase(I)- and a quadrature(Q)-phase-component, which are used to transmit information by means of the phase of the RF signal.

In the example of FIG. 2, the inphase component and the quadrature phase component are processed seperately in the predistortion control device 1, as is indicated by the respective inputs and outputs indicated with reference numbers with the suffixes I and Q. Thus, in the Feedback Path 100, the output signal of the power amplifier 2 is down converted by the down converter 102, and via respective converter outputs 1021I and 1021Q both the I and Q signals are presented to inputs 1030I and 1030Q of a distortion device 102. A dithering signal is added by the distortion device 102 to both signal components.

Both components are then transmitted via distorter outputs 1031I and 1031Q to inputs 1010I and 1010Q of a quantiser 101. Single-bit representations of the I- and Q part of the signals are generated by the quantiser 101 and transmitted via quantiser outputs 1011I and 1011Q to inputs 1101I and 1101Q of the cross-correlator 110.

In the cross-correlator 110, the inphase and quadrature components of the input signal x are presented at inputs 1102I and 1102Q of a single-bit multiplier 111. The quantised inphase (I) and quadrature (Q) signal resulting from the operation on the output signal of the power amplifier 2, are presented at respective inputs 1101I and 1101Q of the multiplier 111. The multiplied signals are then presented via outputs 1112 of the mulitplicator 111 to the averager device 112.

In the predistortion function selector device 120, the following cross-correlation model is implemented. It is supposed that dithering signals added by the distortion devie 103 to the inphase and quadrature components are independent Gaussian noise signals with power $\sigma_{n\_re}^2$ for the in-phase component and $\sigma_{n\_im}^2$ for the quadrature component. Based on this assumption, the relation between the measured correlation function and the complex non-linear transfer (G(x,y)) is modelled as:

$$\int_{-\infty}^{\infty}\int_{-\infty}^{\infty} f(x, y) * g(x, y, \rho) * h(x, y, \rho) * dx \cong R\_m(\rho)$$

with $$f(x, y) = \frac{1}{2\pi} * e^{-\frac{1}{2}(x^2+y^2)}$$

$$g(x, y, \rho) = \mathrm{erf}\left(\frac{\sqrt{|\rho|} * \mathrm{Re}(G(x, y))}{\sqrt{2(1-|\rho|)+\sigma_{n\_re}^2}}\right) + i * \mathrm{erf}\left(\frac{\sqrt{|\rho|} * \mathrm{Im}(G(x, y))}{\sqrt{2(1-|\rho|)+\sigma_{n\_im}^2}}\right)$$

$$h(x, y, \rho) = \mathrm{erf}\left(\frac{\sqrt{|\rho|} * x}{\sqrt{2(1-|\rho|)}}\right) + i * \mathrm{erf}\left(\frac{\sqrt{|\rho|} * y}{\sqrt{2(1-|\rho|)}}\right)$$

in which Re() represents the real part of a signal, Im the imaginary part thereof, and i the square root of minus one. In the predistortion function selector device, the model is fitted to the measured correlation in a manner corresponding to the implementation in the example of FIG. 1.

FIG. 3 schematically shows another example of a predistortion control device 1. In this example, instead of the input contact 30, the output contact 31 of the predistortion device 3 is connected to the second predistortion control input 11. Thereby, the stability of the predistortion control device 1 is increased, because in this example the difference between the input signals of the predistortion control device 1 is based on the power amplifier 2 (and if present the digital-to-analog up converter 4) only.

In the example of FIG. 3, the feedback path 100 includes a clipper (clp) 101 which converts the predistorted signal $x_p$ into a single bit signal. The clipper 101 is connected with an input 1010 to the second predistortion control input 11. An analog-to-digital down converter 102 is connected to the first predistortion control input 10, and an input of the cross-correlator 110. The converter 102 converts the frequency of the amplified signal provided at the output 21 of the power amplifier 2, and converts the amplified signal into a single bit signal.

Figure 8:
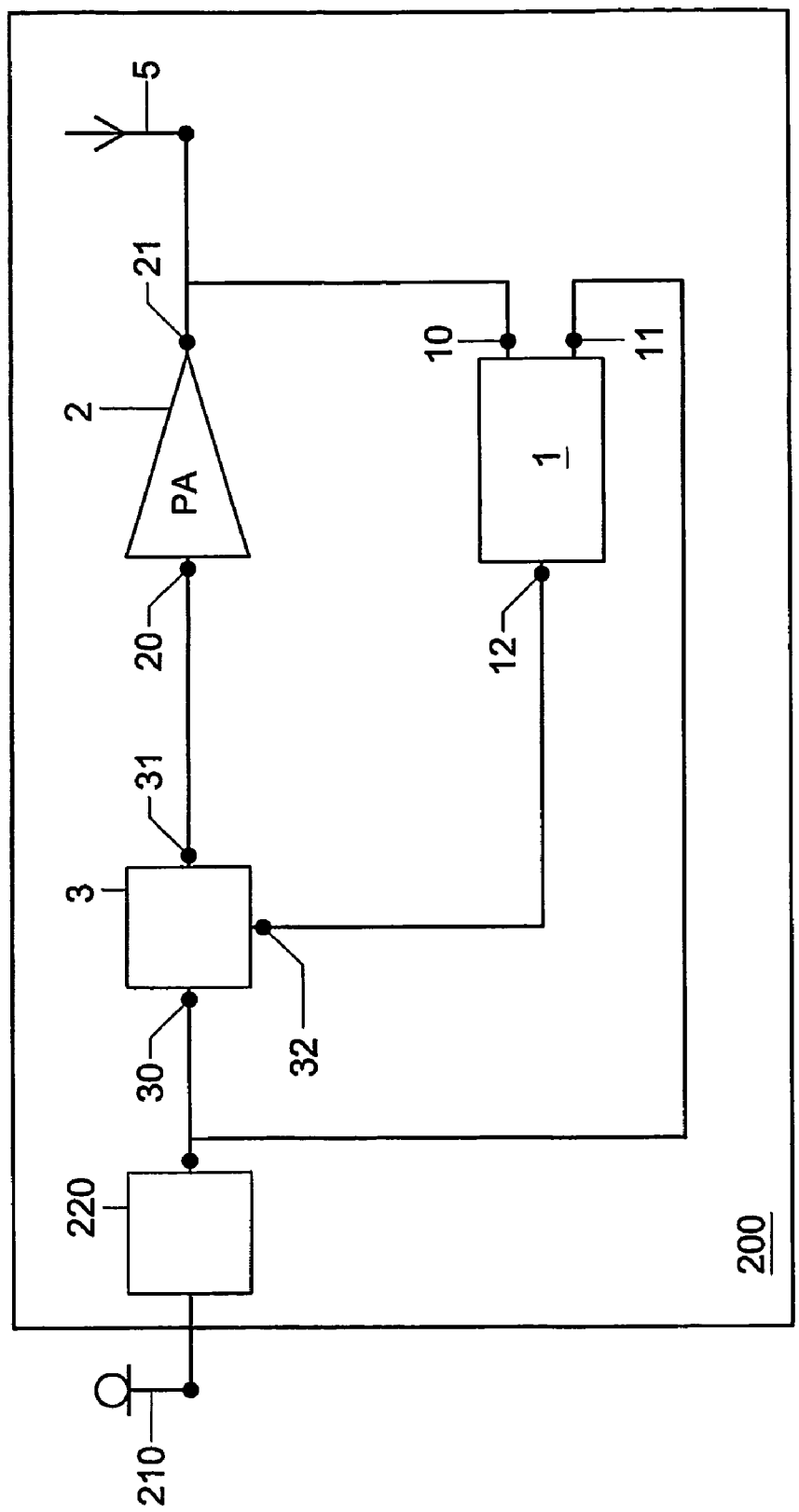
FIG. 8 schematically shows an example of an embodiment of an electronic device according to the invention.

FIG. 8 schematically shows an example of an electronic device 200, such as a mobile telephone or otherwise, including, in that order, an input 210, a signal processor 220, a predistortion device 3, a power amplifier 2 and an output 5. A predistortion control device 1 is connected to the output 21 of the power amplifier and to a control input 32 of the predistortion device 3.

The device 200 has an input, in this example a microphone 210, at which a signal is presented to the device 200. The microphone 210 is connected to the signal processor 220. The signal processor 220 processes the input signal, for example removes noise from the signal converts the input signal to a digital signal in accordance with a telecommunication standard, such as UMTS, etc,. The signal processor 220 outputs the processed signal to the predistortion device 3, which as explained above provides a predistorted signal to the power amplifier 2. The power amplifier 2 amplifiers the predistorted signal and outputs an amplifier signal to the output 5, which in this example is an antenna for transmitting the signal over a wireless connection, for example a UMTS connection, a Bluetooth connection or otherwise.

The amplified signal is also provided at a first input 10 of the predistortion control device 1. The processed signal from the signal processor 200 is also provided at a second input 11 of the predistortion control device 1. The predistortion control device 1 determines a suitable predistortion control function and outputs a corresponding signal to the predistortion control 32 via the control output 12.

It should be noted that the above-mentioned embodiments illustrate rather than limit the invention, and that those skilled in the art will be able to design alternatives without departing from the scope of the appended claims. For example, if the frequency range of the output signal of the power amplifier, is within the input frequency range of the single-bit A/D converter, harmonic subsampling can be applied. instead of the down converter in the examples of FIGS. 1-3. When using subsampling, the single-bit A/D converter directly samples the RF signal with a clockrate smaller than the carrier frequency of the signal of interest, and outputs a signal with a frequency equal to the clockrate. The lowest clockrate that can be used equals twice the bandwidth of the signal of interest.

Also, in the examples the single bit multiplier 111 multiplies two single bit signals. However, if a single bit multiplier is used, it is likewise possible that one of the multiplier input signals is a single bit signal and the other input signal has a bit lengths above one.

Furthermore, separate devices may be integrated in a single physical device. separate devices can be combined in a single physical device. For example, the cross-correlator and the predistortion function selector device can be implemented in a single integrated circuit.

In the claims, any reference signs placed between parentheses shall not be construed as limiting the claim. The word 'including' does not exclude the presence of other elements or steps than those listed in a claim. Unless explicitly provided otherwise, the words 'a' and 'an' do not exclude the presence of more than one of the specified elements or steps. The word 'connected' includes both a direct connection and a connection via other components and/or connection, which is also referred to as an indirect connection. The word 'communicatively connected' includes any connection suitable to transfer a certain signal and derivatives of the signal.

The invention claimed is:

1. A predistortion control device comprising:
   a first predistortion control input selectively connected to a power amplifier output;
   a second predistortion control input selectively connected to a signal contact of a predistortion device; and
   a predistortion control output selectively connected to a control contact of the predistortion device, the predistortion control device further including:
   a cross-correlator device connected with
     a first cross-correlator input to the first predistortion control input and
     a second cross-correlator input to the second predistortion control input, wherein the cross-correlator device further has a cross-correlator output at which a cross-correlation signal can be presented, the cross-correlation signal representing a measured cross-correlation (Rm) of signals presented at the first cross-correlator input and the second cross-correlator input;
   a predistortion function selector device, connected with
     a selector input to the cross-correlator output, and with
     a selector output to the predistortion control output, said pre-distortion function selector device being arranged to compare the measured cross-correlation with a cross-correlation model stored in a memory and determining on the basis of said comparison a suitable predistortion function and presenting a predistortion control signal at said selector output said predistortion control signal representing said predistortion function.

2. The predistortion control device as claimed in claim 1, further including a quantiser device connected with a quantiser input to the first predistortion control input, and with a quantiser output to the first cross-correlator input.

3. The predistortion control device as claimed in claim 2, wherein the quantiser device is a single-bit quantiser.

4. The predistortion control device as claimed in claim 2, wherein the quantiser is operable as a sub-sampling device.

5. The predistortion control device as claimed in claim 2, wherein the cross-correlator device includes a single-bit multiplier.

6. The predistortion control device as claimed in claim 2, further including a distortion device connected with a distortion input to the first predistortion control input, and connected with a distortion output to the quantiser input.

7. The predistortion control device as claimed in claim 6, wherein the distortion device includes a random distortion device.

8. The predistortion control device as claimed in claim 6, wherein the distortion device includes a periodic distortion device.

9. The predistortion control device as claimed in claim 1, wherein the second predistortion control input is connectable to a signal output of a predistortion device.

10. The predistortion control device as claimed in claim 1, further including:
an averaging device capable of determining a time averaged cross-correlation value from a memory connected to the cross-correlator output, for storing a number of cross-correlation values, wherein the averaging device has an averaging output connected to the selector input, for presenting time averaged cross-correlation values to the predistortion function selector device.

11. The predistortion control device, as claimed in claim 1 further comprising:
a predistortion input for receiving an original signal to be predistorted;
a predistortion output for providing a predistorted output signal based on the original signal, and
a control input contact connected to the predistortion control output at which a predistortion control signal can be provided, in response to which predistortion control signal the predistortion device uses a predistortion function corresponding to the predistortion control signal to generate the predistorted output signal.

12. The predistortion control device as claimed in claim 11, further including a power amplifier connected with:
an amplifier input to the predistortion output, and
an amplifier output to the first predistortion control input.

13. A predistortion control method, comprising the steps of:
receiving a power amplifier output signal;
receiving a predistortion signal from a signal contact of a predistortion device;
determining a measured cross-correlation value by cross-correlating the power amplifier output signal and the predistortion signal;
comparing the measured cross-correlation value with a cross-correlation model;
determining a suitable predistortion function from said comparing step, and
providing a predistortion control signal representing said predistortion function.

14. The predistortion control method, as claimed in claim 13, further comprising:
minimising a difference between the measured cross-correlation value with a model cross-correlation value, and
deriving from said minimizing step the predistortion function.

15. An arrangement for controlling predistortion in a power amplifier, the arrangement comprising:
a predistortion control device;
a first predistortion control input selectively connected to a power amplifier output;
a second predistortion control input selectively connected to a signal contact of a predistortion device; and
a predistortion control output selectively connected to a control contact of the predistortion device, the predistortion control device further including:
a cross-correlator device connected with
a first cross-correlator input to the first predistortion control input and
a second cross-correlator input to the second predistortion control input, wherein the cross-correlator device further has a cross-correlator output at which a cross-correlation signal can be presented, the cross-correlation signal representing a measured cross-correlation ($R_m$) of signals presented at the first cross-correlator input and the second cross-correlator input;
a predistortion function selector device, connected with
a selector input to the cross-correlator output, and with a selector output to the predistortion control output, said pre-distortion function selector device being arranged to compare the measured cross-correlation with a cross-correlation model stored in a memory and determining on the basis of said comparison a suitable predistortion function and presenting a predistortion control signal at said selector output said predistortion control signal representing said predistortion function.

16. The arrangement as claimed in claim 15, further including a quantiser device connected with a quantiser input to the first predistortion control input, and with a quantiser output to the first cross-correlator input.

17. The arrangement as claimed in claim 15, wherein the quantiser device is a single-bit quantiser.

18. The arrangement as claimed in claim 16, wherein the quantiser is operable as a sub-sampling device.

19. The arrangement as claimed in claim 16, wherein the cross-correlator device includes a single-bit multiplier.

20. The arrangement as claimed in claim 16, further including a distortion device connected with a distortion input to the first predistortion control input, and connected with a distortion output to the quantiser input.

21. The arrangement as claimed in claim 20, wherein the distortion device includes a random distortion device.

22. The arrangement as claimed in claim 20, wherein the distortion device includes a periodic distortion device.

23. The arrangement as claimed in claim 15, wherein the second predistortion control input is connectable to a signal output of a predistortion device.

24. The arrangement as claimed in claim 15, further including:
an averaging device capable of determining a time averaged cross-correlation value from a memory connected to the cross-correlator output, for storing a number of cross-correlation values, wherein the averaging device has an averaging output connected to the selector input, for presenting time averaged cross-correlation values to the predistortion function selector device.

25. The arrangement as claimed in claim 15, further comprising:
   a predistortion input for receiving an original signal to be predistorted;
   a predistortion output for providing a predistorted output signal based on the original signal, and
   a control input contact connected to the predistortion control output at which a predistortion control signal can be provided, in response to which predistortion control signal the predistortion device uses a predistortion function corresponding to the predistortion control signal to generate the predistorted output signal.

26. The arrangement as claimed in claim 25, wherein the power amplifier is connected with:
   an amplifier input to the predistortion output, and
   an amplifier output to the first predistortion control input.

\* \* \* \* \*